US006437645B1

(12) United States Patent
Ivanov et al.

(10) Patent No.: US 6,437,645 B1
(45) Date of Patent: Aug. 20, 2002

(54) SLEW RATE BOOST CIRCUITRY AND METHOD

(75) Inventors: Vadim V. Ivanov; David R. Baum, both of Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 21 days.

(21) Appl. No.: 09/784,724

(22) Filed: Feb. 15, 2001

(51) Int. Cl.[7] ............................................... H03F 3/45
(52) U.S. Cl. ....................... 330/255; 330/257; 330/300
(58) Field of Search ................................ 330/255, 257, 330/300

(56) References Cited

U.S. PATENT DOCUMENTS

| 4,783,637 A | 11/1988 | Cotreau ...................... 330/295 |
| 5,311,145 A | 5/1994 | Huijsing et al. ............ 330/255 |
| 5,374,897 A | * 12/1994 | Moraveji ..................... 330/252 |
| 5,483,182 A | 1/1996 | Rybicki ........................... 327/5 |
| 5,510,754 A | 4/1996 | Moraveji et al. ........... 330/267 |
| 5,512,859 A | 4/1996 | Moraveji .................... 330/267 |

OTHER PUBLICATIONS

"A Class–AB High–Speed Low–Power Operational Amplifier in BiCMOS Technology" by Subhajit Sen and Bosco Leung, IEEE Journal of Solid–State Circuits, vol. 31, No. 9, Sep. 1996, pp. 1325–1329.

"Fast Slewing Monolithic Operational Amplifier" by William E. Hearn, IEEE Journal of Solid–State Circuits, vol. SC–6, No. 1, Feb. 1971, pp. 20–24.

* cited by examiner

Primary Examiner—Michael B Shingleton
(74) Attorney, Agent, or Firm—W. Daniel Swayze, Jr.; W. James Brady; Frederick J. Telecky, Jr.

(57) ABSTRACT

A differential input circuit (1) includes circuitry for generating slew boost currents to be supplied to an output stage of an operational amplifier. The differential input circuit (1) includes a differential current steering circuit including a first transistor (M2) having a gate coupled to receive a first input signal (Vin−), a second transistor (M3) having a gate coupled to receive a second input signal (Vin+), and a constant current source (20) coupled to sources of the first and second transistors, and providing first (4 or 6) and second (5 or 7) outputs of the differential input circuit coupled to the first (M2) and second (M3), respectively. A first slew current circuit is operated in response to the first input signal (Vin−) to produce a first slew boost current which is introduced into a current summing conductor (9) coupled to the sources of the first (M2) and second (M3) transistors and the constant current source (20). A second slew current circuit is operated in response to the second input signal (Vin+) to produce a second slew boost current which is introduced into the current summing conductor (9), wherein the first and second slew boost currents boosting currents flow through the second (M3) and first (M2) transistors, respectively.

22 Claims, 4 Drawing Sheets

SLEW RATE BOOST CIRCUITRY AND METHOD

BACKGROUND OF THE INVENTION

The invention relates to a circuit and technique for increasing the slew rate of an operational amplifier, and also for increasing the slew rate of a differential amplifier.

The term "slew rate" of an amplifier is a measure of how fast the amplifier can charge up a large capacitor that is connected to an output conductor of the amplifier in response to a very rapid increase or decrease (such as a step function increase or decrease) of the input voltage applied to the amplifier. A high slew rate generally is a desirable characteristic of an amplifier, especially an operational amplifier, and particularly a high-speed CMOS or biCMOS operational amplifier.

The slew rate of an amplifier generally is equal the tail current used in the amplifier divided by the sum of the compensation capacitance required and the parasitic capacitance of the output transistor. One technique for increasing the slew rate of an amplifier is to increase the bias current of the input stage, but that has a tendency to increase the bandwidth of the amplifier. That leads to a need to increase the compensation capacitance of the amplifier to improve circuit stability, which tends to decrease the slew rate.

The article "A Class-AB High-Speed Low-Power Operational Amplifier in BiCMOS Technology", by Subhajit Sen and Bosco Leung, IEEE Journal of Solid-State Circuits, Volume 31, No. 9, September 1986 describes a BiCMOS operational amplifier designed to have very high transconductance, a high slew rate, and a fast small-signal-settling response.

Prior art FIG. 1 is a schematic diagram of an operational amplifier circuit that is very similar to one disclosed in the above Sen and Leung article. If the input voltage in− is increased, the voltages on nodes D and A also increase, because a constant current (supplied by a constant current P-channel transistor) flows through transistor Q9 and transistor MP22. The increased voltage on node A turns transistor Q1 on harder, increasing current supplied into node B, providing an increase in the slew-down rate of the output voltage vo, by turning transistors Q6 and Q11 on harder. Similarly, if the input voltage in+ increases, transistor Q2 is turned on harder, and supplies additional current through transistor Q3 and Q5, which turns transistor Q7 on harder, lowering the voltage on node E and turning on transistor MP7 harder, providing an increased slew-up current into the output conductor vo.

The circuit described has the further shortcoming of having an undesirably low commonmode rejection ratio (CMRR), an undesirably narrow power supply rejection ratio (PSRR), and an undesirably large input offset voltage. Furthermore, the noise produced by the circuit in prior art FIG. 1 is too high for some applications.

U.S. Pat. Nos. 4,783,637, 5,512,859 and 5,510,754 disclose amplifiers designed to have high slew rates.

There has long been a need for an inexpensive, high-speed, high slew rate integrated circuit operational amplifier which has not been satisfied prior to the present invention.

SUMMARY OF THE INVENTION

Accordingly, it is an object of the invention to provide a high-speed integrated circuit operational amplifier having a high common mode rejection ratio and a high slew rate.

It is another object of the invention to provide a high-speed integrated circuit operational amplifier having a high common mode rejection ratio, a high slew rate, and low noise.

It is another object of the invention to provide a differential input circuit having a high common mode rejection ratio for producing slew boost currents for output circuitry of an operational amplifier.

It is another object of the invention to provide a differential input circuit having a high common mode rejection ratio and low noise, and producing slew boost currents for output circuitry of an operational amplifier.

Briefly described, and in accordance with one embodiment thereof, the invention provides an differential input circuit (1) for generating slew boost currents for an output stage of an operational amplifier. In one embodiment, the invention provides a technique of operating the differential input circuit (1) to provide slew boost currents by providing a differential current steering circuit that includes a first transistor (M2) having a gate coupled to receive a first input signal (Vin−), a second transistor (M3) having a gate coupled to receive a second input signal Vin+, and a constant current source (20) coupled to sources of the first and second transistors, and providing first (4 or 6) and second (5 or 7) outputs of the differential input circuit coupled to the first (M2) and second (M3), respectively. A first slew current circuit is operated in response to the first input signal (Vin−) to produce a first slew boost current which is introduced into a current summing conductor (9) coupled to the sources of the first (M2) and second (M3) transistors and the constant current source (20). A second slew current circuit is operated in response to the second input signal (Vin+) to produce a second slew boost current which is introduced into the current summing conductor (9), wherein the first and second slew boost currents boosting currents flow through the second (M3) and first (M2) transistors, respectively. The first and second output conductors are coupled to the second and first transistors so as to cause the currents flowing through the first (M2) and second (M3) transistors to flow through the first and second output conductors, respectively. In one embodiment, the drains of the first (M2) and second (M3) transistors are coupled directly to the first (6) and second (7) outputs of the differential input circuit (1), respectively. In another embodiment the current summing conductor (9) is coupled to third (4) and fourth (5) outputs of the differential input circuit (1) by means of third (Q2) third (Q2) and fourth (Q3) transistors, respectively. In another embodiment, the current summing conductor (9) is coupled to the first (4) and second (5) outputs of the differential input circuit (1) by means of third (Q2) and fourth (Q3) transistors, respectively.

In one embodiment, the differential input circuit (1) includes a differential current steering circuit including a first transistor (M2) having a gate coupled to receive a first input signal (Vin−), a second transistor (M3) having a gate coupled to receive a second input signal Vin+, and a constant current source (20) coupled to sources of the first and second transistors, the first (M2) and second (M3) transistors having drains connected to first (6) and second (7) outputs of the differential input circuit, respectively. A first slew current circuit includes a third transistor (M1) having a gate coupled to the gate of the first transistor (M2), a drain coupled to a first supply voltage conductor (GND), a fourth transistor (Q1) having a first electrode coupled to a source of the third transistor (M1), and a second electrode and a control electrode coupled to a second constant current source (19), and a fourth transistor (Q2) having a control electrode coupled to the control electrode of the third transistor (M1), a first electrode coupled by a first conductor (9) to the source of the first transistor (M2), and a second electrode coupled to a third output (4) of the differential input circuit (1). A second slew current circuit includes a sixth transistor (M4) having a gate coupled to the gate of the second transistor (M3), a drain coupled to the first supply voltage conductor (GND), a seventh transistor (Q4) having a first electrode coupled to a source of the sixth transistor (M4), and a second electrode and a control electrode coupled to a third constant current source (21), and an eighth transistor (Q3) having a control electrode coupled to the control electrode of the sixth transistor (M4), a first electrode coupled by the first conductor (9) to the source of the second transistor (M3), and a second electrode coupled to a fourth output (5) of the differential input circuit (1). The output circuit includes a pull-up transistor (M8) coupled to at least one of the third (4) and fourth (5) outputs of the differential input circuit (1), and a pull-down transistor (M10) coupled to at least one of the first (6) and second (7) outputs of the differential input circuit (1). The output circuit also includes first folded cascode transistor circuitry coupling the first (6) and second (7) outputs of the differential input circuit (1) to the gate of the pull-down transistor (M10), and second folded cascode transistor circuitry coupling the third (4) and fourth (5) outputs of the differential input circuit (1) to the gate of the pull-up transistor (M8). In one embodiment, the operational amplifier further includes a first gain boost amplifier (23) coupled between an output of the first folded cascode transistor circuitry and the gate of the pull-up transistor (M8), and a second gain boost amplifier (24) coupled between an output of the second folded cascode transistor circuitry and the gate of the pull-down transistor (M10).

DETAILED DESCRIPTION OF THE PREFERRED EMBODIMENTS

Figure 2A:
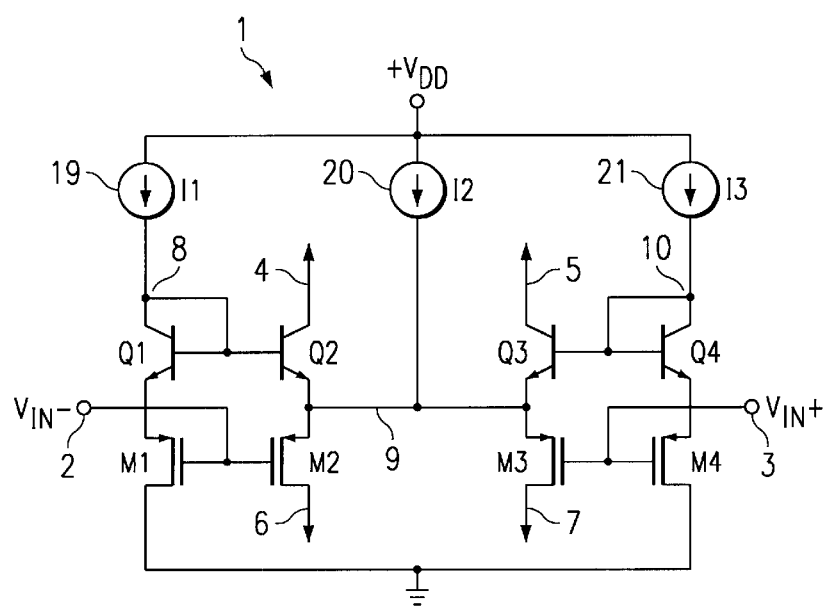
FIG. 2A is a schematic diagram of a differential input circuit of the present invention.

Referring to FIG. 2A, differential input circuit 1 includes a pair of inputs 2 and 3 to which input signals Vin⁻ and Vin⁺ are applied, respectively. Conductor 2 is connected to the gate electrodes of P-channel transistors M1 and M2. Conductor 3 is connected to the gates of P-5 channel transistors M3 and M4. The drains of transistors M1 and M4 are connected to ground. The drains of transistors M2 and M3 are output conductors of differential input stage 1 which, as subsequently explained, are connected to corresponding folded cascode transistors of an amplifier circuit in which differential input stage 1 is used. The source of transistor M1 is connected to the emitter of an NPN transistor Q1 having its base and collector connected to one terminal of a constant current source 19 having another terminal connected to +$V_{DD}$. The base of transistor Q1 is connected to the base of an NPN transistor Q2 having its emitter connected by conductor nine to the source of transistor M2, one terminal of constant current source 20, the source of transistor M3, and to the emitter of an NPN-channel transistor Q3. The collectors of transistors Q2 and Q3 are connected, respectively, to conductors 4 and 5, which are additional output conductors of differential input circuit 1. The source of transistor M4 is connected to the emitter of an NPN transistor Q4 having its base and collector connected by conductor 10 to the base of transistor Q3 and to one terminal of a constant current source 21 having another terminal connected to +$V_{DD}$.

Note that transistors M2, M3, Q2, and Q3 and constant current source 20 can be thought of as a differential current steering circuit. The circuitry including transistors M1, Q1 and Q2 can be thought of as a first slew boost circuit, and the circuitry including transistors M4, Q4, and Q3 can be thought of as a second slew boost circuit.

It should be noted that in some cases conductors 4 and 5 can be connected to +$V_{DD}$, So that conductors 6 and 7 constitute the only outputs of differential input circuit 1.

Figure 2B:
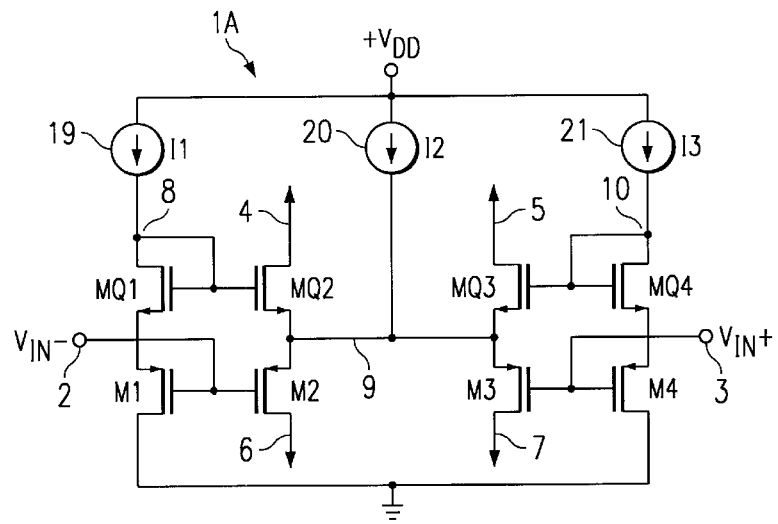
FIG. 2B is a schematic diagram of variation of the differential input circuit of FIG. 2A in which MOS transistors are used instead of bipolar transistors Q1–4.

FIG. 2B shows a differential input stage 1A in which N-channel transistors MQ1–4 are used in place of NPN transistors Q1–4 of FIG. 2A. The common mode rejection range of the differential input circuit 1 of FIG. 2B is less than that of differential input circuit 1 of FIG. 2A. This is because in FIG. 2A the common mode rejection range is limited by the sum of the gate-to-source voltage of transistor M1 and the base-to-emitter voltage of transistor Q1, which is less than the corresponding quantity associated with differential input circuit 1A of FIG. 2B. In the latter circuit, the common mode rejection range is limited by the sum of the gate-to-source voltages of transistors M1 and MQ1, which is larger because the $V_{BE}$ voltage of NPN transistor Q1 of FIG. 2A use less than the $V_{GS}$ voltage of transistor MQ1 of FIG. 2B.

Significant generation of slew-boost current in differential input circuit 11 of FIG. 2A begins when the differential input voltage between input conductors 2 and 3 is in the range of 20 millivolts to 50 millivolts. For example, as Vin− increases relative to Vin+, the voltage on conductor 8 tends to "follow" Vin− up, which turns transistor Q2 on harder so it supplies increasing amounts of slew boost current into summing conductor 9. At the same time, the increasing of Vin− relative to Vin+ tends to turn transistor M2 off. The transistor M3 is turned on harder by the increased current from transistor Q2 into conductor 9. The current flowing through transistor Q1 from constant current source I1 is added to the tail current I2, so the current through transistor M3 is equal to the sum of I2 and the product of I1 multiplied by the current gain beta of transistor Q2. Transistors M1, Q1, and Q2 function to maintain the minimum current in transistor M2 at a fairly stable value when Vin− is significantly greater than Vin+, because increasing Vin− does not substantially change the gate-to-source voltages of transistors M1 and M2, so their current are fairly stable.

An important advantage of differential input circuit 1A is that it increases the common mode rejection ratio (CMRR) of differential input circuit 1A and any operational amplifier that includes differential input circuit 1A.

Figure 1:
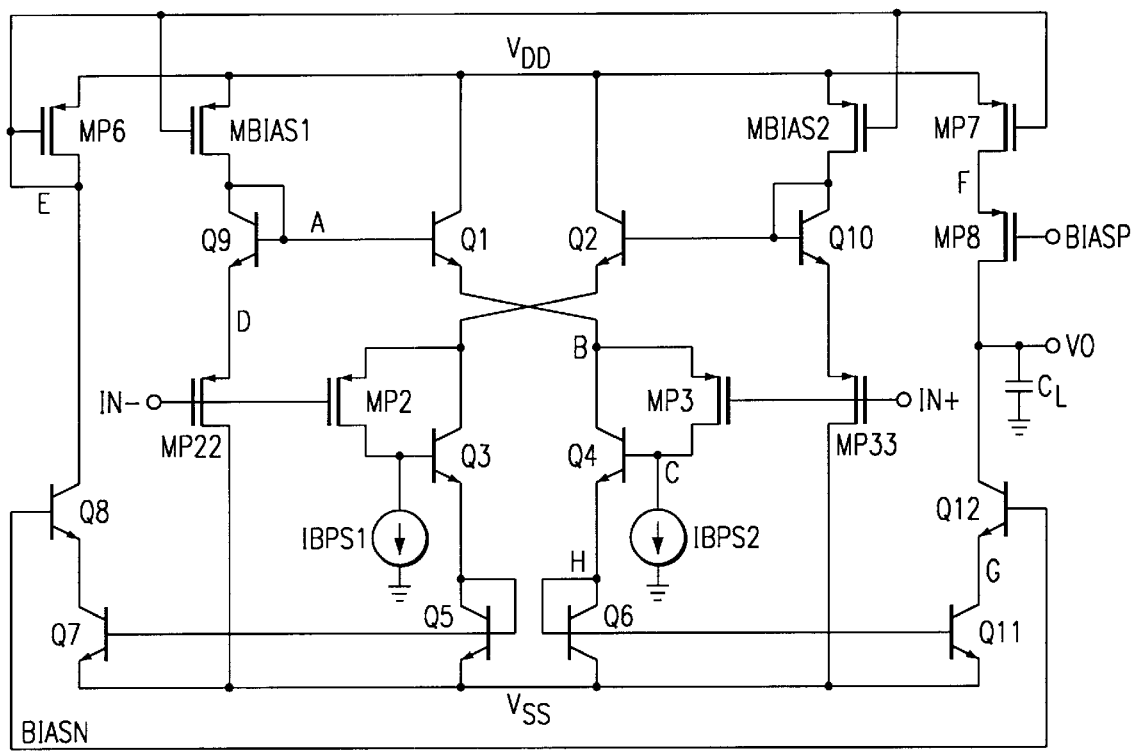
FIG. 1 is a schematic diagram of a prior art operational amplifier including slew rate boost circuitry.

Another important advantage of differential input circuit 1A is that it generates only approximately half of the noise of the differential input circuit of prior art FIG. 1, because the noise generated by differential input circuit 1A is determined mainly by only two transistors, transistor M2 and transistor M3, whereas in prior art FIG. 1 all of the transistors in the circuit contribute substantially to generation of noise.

It should be noted that if the differential input voltage between input conductors 2 and 3 is zero, transistors Q2 and Q3 not quite completely off. This is in contrast to the differential input circuit in prior art FIG. 1, in which transistors Q3 and Q4 are completely off if the differential input voltage is below a predetermined virtual voltage established by the values of Ibps1 and Ibps2. The above mentioned 20 millivolt to 50 millivolt range is determined by the ratio of the channel-width-to-channel-length ratio of transistor M1 to that of transistor M2, and also by the corresponding channel-width-to-channel-length ratio of transistor M4 to that of transistor M3. The 20 millivolt to 50 millivolt range also is determined by the values of I1–3.

The structure of differential input circuit 1 of FIG. 2A differs from the differential input circuit shown in prior art FIG. 1 in the following ways. First, the emitters of transistors Q2 and Q3 and transistors M2 and M3 are directly connected together, unlike prior art FIG. 1 in which the emitter of transistor Q1 is cross-connected only to the collector of transistor Q4 and the source of transistor MP3, and in which the emitter of transistor Q2 is cross-connected only to the collector of transistor Q3 and transistor MP2. Furthermore, there is nothing in differential input circuit 11 of FIG. 2A comparable to the current sources Ibps1 and Ibps2. Constant current source 20 of FIG. 2A is not present in the circuit of prior art FIG. 1. The sizes of the transistors in FIG. 2A have been selected to make the current through transistors Q1 and Q2 very small, in order to provide high CMRR. A signal inversion that is provided on each side in prior art FIG. 1 has been eliminated. For example, an inversion caused by transistor MP2 and the current source Ibps in prior art FIG. 1, has been eliminated.

Figure 3A:
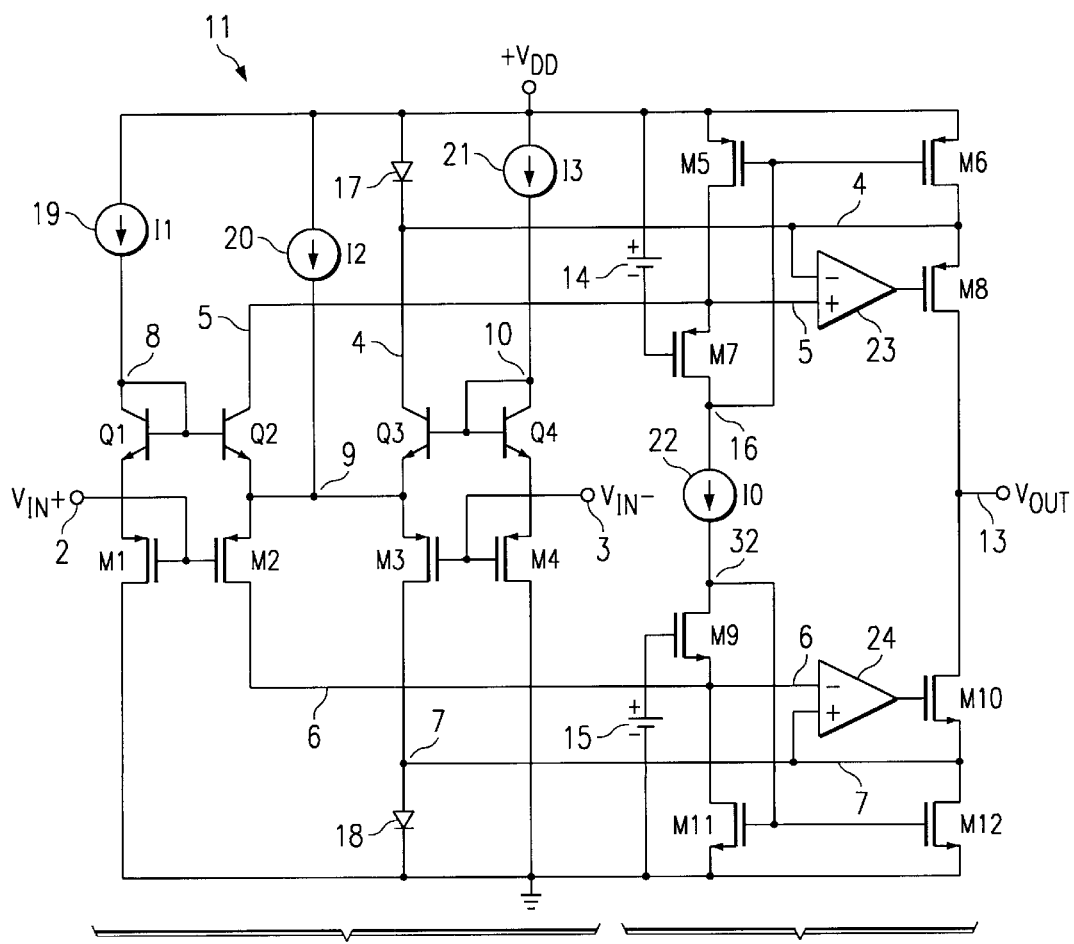
FIG. 3A is a schematic diagram of an operational amplifier including the differential input circuit of FIG. 2A.

FIG. 3A shows an operational amplifier 11 which includes differential input stage 1 of FIG. 2 and also includes an output stage 12. However, in FIG. 3A, Vin+ and Vin– are applied to conductors 2 and 3, respectively, instead of vice versa as in FIG. 2A. Output stage 12 includes a P-channel output transistor M8 having its drain connected to an output conductor 13 on which an output signal Vout is produced. The gate of transistor M8 is connected to the output of a gain boost amplifier 23 having its (–) input connected by conductor 4 back to the source of transistor M8. Conductor 4 also is connected to the drain of a P-channel transistor M6 having its source connected to +$V_{DD}$. Conductor 4 also is connected to one terminal of a clamp circuit 17 having another terminal connected to $V_{DD}$. (One implementation of clamp circuit 17 is shown in subsequently described FIG. 5.) Conductor 4 also is connected to the collector of transistor Q3, as described above with reference to FIG. 2A.

The (+) input of amplifier 23 is connected by conductor 5 to the source of a P-channel transistor M7 and the drain of a P-channel transistor M5. As described above with reference to FIG. 2A, conductor 5 also is connected to the collector of transistor Q2. The gate of transistor M6 is connected by conductor 16 to the gate of transistor M5 and the drain of transistor M7. Transistor M5 has its source connected to +$V_{DD}$. The gate of transistor M7 is connected to a bias voltage provided by a bias voltage source 14 having its (+) terminal connected to +$V_{DD}$.

Output circuit 12 also includes an N-channel output transistor M10 having its drain connected to output conductor 13 and its gate connected to the output of a gain boost amplifier 24. The source of transistor M10 is connected by conductor 7 the drain of an N-channel transistor M12, the (+) input of gain boost amplifier 24, and one terminal of a clamp circuit 18 in differential input circuit 1. The source of transistor M12 is connected to ground. Clamp circuit 18 has another terminal connected ground. The gate of transistor M12 is connected by conductor 32 to the gate of an N-channel transistor M11 and to the drain of an N-channel transistor M9. The source of transistor M9 is connected to conductor 6. The source of transistor M11 is connected to ground. The drain of N-channel transistor M11 is connected by conductor 6 to the source of transistor M9 and the (–) input of gain boost amplifier 24. As explained above with reference to FIG. 2A, conductor 6 also is connected to the drain of transistor M2. A constant current source 22 is connected between conductors 16 and 32. The gate of transistor M9 is connected to the (+) of a constant voltage source 15 having its (–) terminal connected to ground.

If Vin– on conductor 3 is substantially greater than Vin+ on conductor 2, then the slew boost circuit including transistors M4, Q4 and Q3 causes increased current to flow through transistor Q3. That increased current flows into conductor 9 and is added to the tail current I2, and the combined current flows through transistor M2 and transistor M11. The current through transistors M3 and M4 remains relatively unchanged. The current in transistor M11 is mirrored through transistor M12, producing a large slew-down current flowing from Vout conductor 13 through transistor M10 and transistor M12. The increased current in transistor Q3 tends to cause the voltage on conductor 4 to decrease. Clamping circuit 17 prevents the voltage on conductor 4 from decreasing enough to cause any slew-up current from being generated in output transistor M8.

Similarly, if Vin+ is substantially greater than Vin+, then the slew boost circuit including transistors M1, Q1 and Q2 causes increased current to flow through transistor Q2 and conductor from transistor M5. That current flows from the emitter of transistor Q2 into conductor 9 and is combined with tail current I2. The combined current flows through transistor M3 and clamp circuit 18. The large current flowing through transistor M5 is mirrored through transistor M6 to thereby supply a large slew-up current through transistor M8 into Vout conductor 13. The increased current through transistor Q2 tends to cause the voltage on conductor 7 to increase. Clamp circuit 18 prevents the voltage on conductor 7 from increasing enough to cause a slew-down current from being simultaneously generated in transistor M10.

Figure 3B:
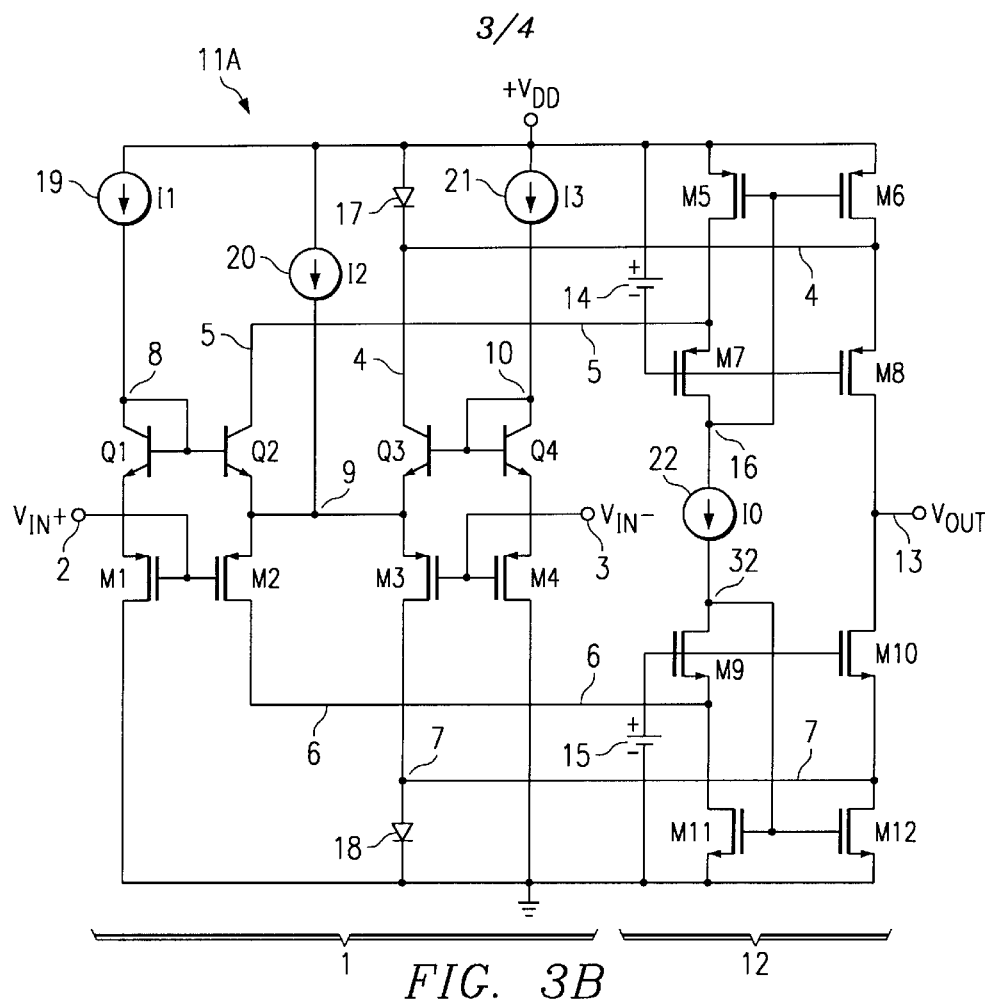
FIG. 3B is a schematic diagram of a variation of the operational amplifier of FIG. 3A wherein the gain boost amplifiers 23 and 24 are omitted.

Referring to FIG. 3B, operational amplifier 11A is the same as operational amplifier 11 of FIG. 3A except that gain boost amplifiers 23 and 24 have been omitted. Instead, the (–) terminal of constant voltage source 14 is connected to the gate electrodes of both transistors M7 and M8. Similarly, the (+) terminal of constant voltage source 15 is connected directly to the gates of both transistors M9 and M10. Note that use of the slew boost amplifiers increases the gain of the operational amplifier 11 in FIG. 3A over that of operational amplifier 11A in FIG. 3B.

Figure 4:
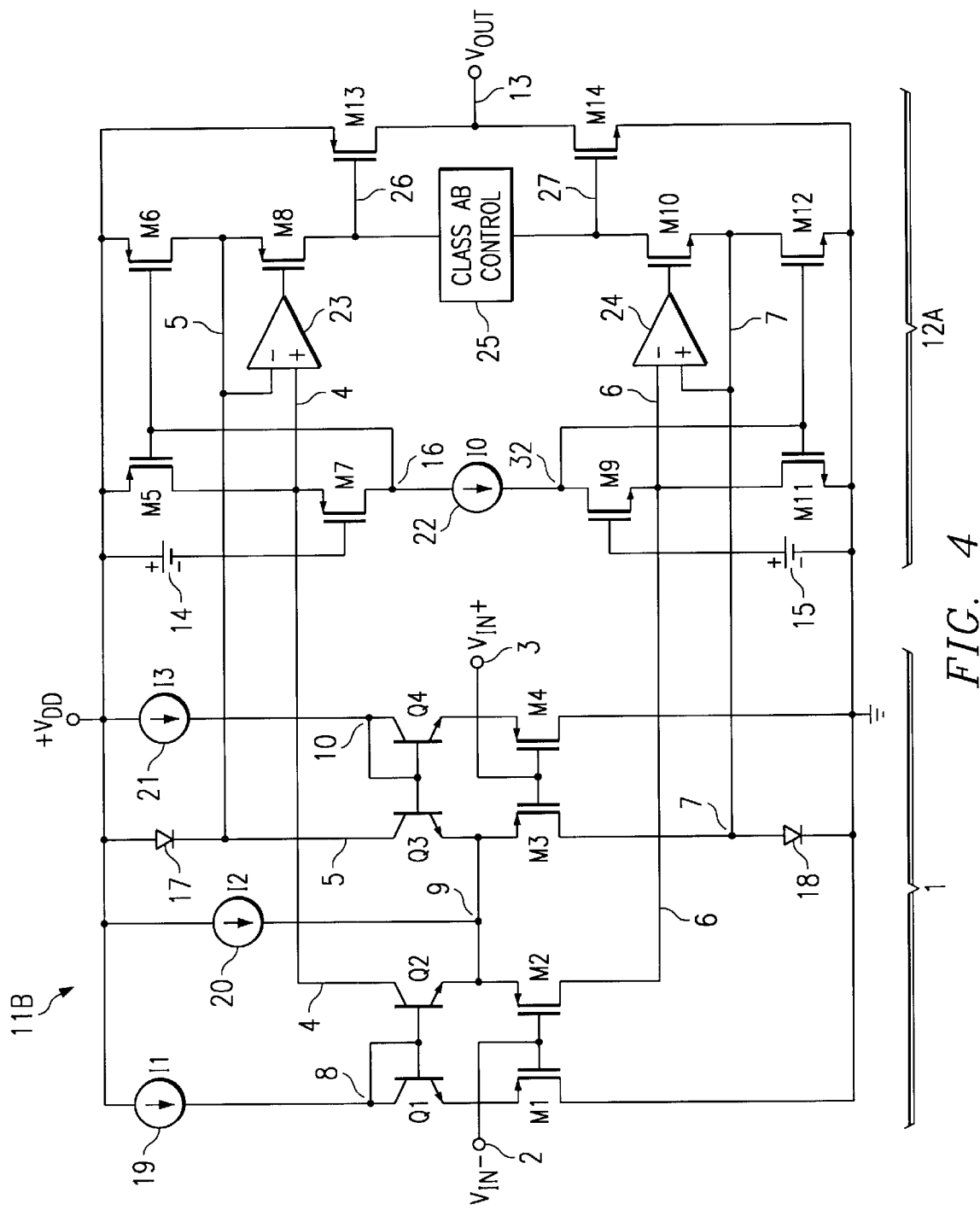
FIG. 4 is a schematic diagram of another operational amplifier including the differential input circuit of FIG. 2A

FIG. 4 shows another operational amplifier 11A which is essentially identical to operational amplifier 11 of FIG. 3A. In FIG. 4, output stage 12A is nearly identical to output stage 12 in FIG. 3A, except output stage 12A of FIG. 4 further includes a class AB control circuit 25 connected between the drain of transistor M8 and the drain of transistor M10 by conductors 26 and 27, respectively. Conductors 26 and 27 are connected to the gates of P-channel output transistor M13 and N-channel output transistor M14, respectively, the drains of which are connected to output conductor 13. The sources of output transistors M13 and M14 are connected to +$V_{DD}$ and ground, respectively. Class AB control circuit 25 can be a conventional class AB control circuit such as the one disclosed in U.S. Pat. No. 5,311,145 entitled "COMBINATION DRIVER-SUMMING CIRCUIT FOR RAIL-TO-RAIL DIFFERENTIAL AMPLIFIER" issued May 10, 1984 to Huijsing.

Figure 5:
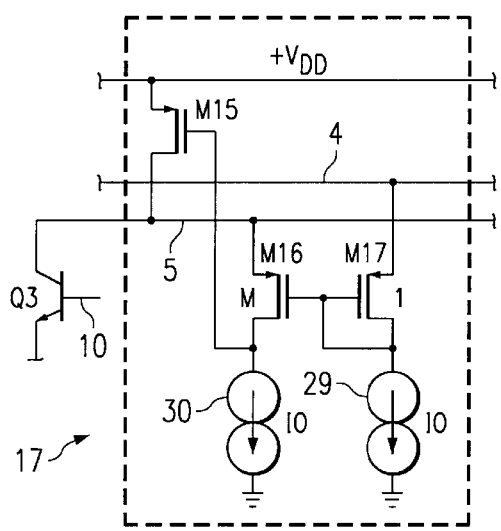
FIG. 5 is a schematic diagram of a clamping circuit used in FIGS. 3A, 3B and 4.

FIG. 5 shows a schematic diagram of clamping circuit 17 of FIGS. 3A, 3B and 4. Clamping circuit 17 includes a P-channel transistor M15 having its source connected to +$V_{DD}$ and its drain connected to output conductor 5 of differential input circuit 1. The gate of transistor M15 is connected to the drain of a P-channel transistor M16 and to one terminal of a constant current source 17 having its other terminal connected to ground. The source of transistor M16 is connected to output conductor 5 of differential input stage 1. The gate of transistor M16 is connected to the gate and drain of a P-channel transistor M17 having its source connected to output conductor 4 of differential input circuit 1. (Alternatively, the source of transistor M17 could be connected to a constant voltage source, although the illustrated configuration is preferable.) The gate and drain of transistor M17 also are connected to one terminal of constant current source 29, another terminal of which is connected to ground.

The channel-with-to-channel-length ratio of transistor M16 is m times that of transistor M17. A constant current 10 is supplied by both of constant current sources 17 and 29. If there are equal currents or voltages on conductors 4 and 5, then, since transistor M16 has a substantially larger channel-with-to-channel-length ratio than transistor M17, the gate voltage of transistor M15 is nearly equal to the voltage on conductor 5. Then, if transistor Q3 causes a large current to flow through conductor 5, the voltage of conductor 5 decreases. When the voltage of conductor 5 exceeds the offset voltage between transistors M16 and M17 (which is established by their geometry ratio m), then the gate voltage of transistor M15 decreases, which turns transistor M15 on harder so it allows the excess of the current through conductor 5 to be supplied from +$V_{DD}$.

Clamping circuit 18 in FIGS. 3A, 3B and 4 is essentially a mirror image of clamping circuit 17, wherein transistor M15 is replaced by an N-channel transistor having its source connected to ground, its drain connected to conductor 7, and transistors M16 and M17 are replaced by corresponding N-channel transistors having their sources connected to conductors 7 and 6, respectively, and current sources 17 and 29 are connected to +$V_{DD}$, and the currents I0 therein flow from +$V_{DD}$ toward ground.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

Figure 6:
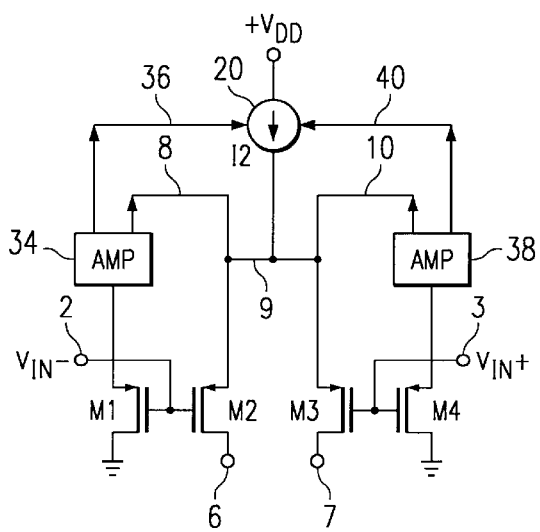
FIG. 6 is a schematic diagram of a more generalized version of the differential input circuit of FIG. 2A.

For example, in FIG. 2A, the emitters of transistors Q2 and Q3 do not necessarily have to be connected directly to summing conductor 9. Instead, the emitters or collectors of transistors Q2 and Q3 can be coupled to circuitry of tail current source 20 so as to increase the current I2 therein, and thereby indirectly, rather than directly, increase the flow of current into summing conductor 9. Or, transistor M1 can be thought of as a sensing device which produces a current representative of the gate-to-source voltage of transistor M2, and that current can be utilized to directly increase the amount of current flowing into conductor 9 or to indirectly increase the amount of current flowing into the conductor 9 by increasing the current flowing from tail current source 20 into conductor 9. Similarly, transistor M4 can be thought of as another sensing device which produces a current representative of the gate-to-source voltage of transistor M2, and that current can be utilized to directly increase the amount of current flowing into conductor 9 or to indirectly increase the amount of current flowing into conductor 9 by increasing the current flowing from tail current source 20 into conductor 9. For example, in FIG. 6, transistor M1 and transistor M4 are sensing transistors which produce source currents representative of the gate-to-source voltages of input transistors M2 and M3, respectively. The source current of sensing transistor M1 is an input signal to an amplifier circuit 34. Amplifier circuit 34 produces an output 36 which is connected as a control input to tail current source 20 and increases the tail current I2 flowing into summing conductor 9 if Vin− exceeds Vin+ by more than a predetermined amount. If Vin− exceeds Vin+ by more than the predetermined amount, then amplifier circuit 34 also produces an output 8 which is connected to conductor 9 source so as to maintain a minimum current in input transistor M2 that is approximately equal to the mineral value of the tail current I2 divided by 2.

Similarly, the source current of sensing transistor M4 is an input signal to an amplifier circuit 38. Amplifier circuit 38 produces an output 40 which is connected as another control input to tail current source 20 and increases the tail current I2 flowing into summing conductor 9 if Vin+ exceeds Vin− by more than the predetermined amount. If Vin+ exceeds Vin− by more than the predetermined amount, then amplifier circuit 38 also produces an output can which is connected to conductor 9 source so as to maintain a minimum current in input transistor M3 that is approximately equal to the mineral value of the tail current I2 divided by 2.

What is claimed is:

1. A method of operating a differential input circuit to provide slew boost currents to an output circuit, comprising:
    (a) providing a differential current steering circuit including a first transistor having a gate coupled to receive a first input signal, a second transistor having a gate coupled to receive a second input signal, and a tail current source coupled to sources of the first and second transistors, and providing first and second outputs of the differential input circuit coupled to the first and second transistors, respectively;
    (b) operating a first amplifying circuit of the differential input circuit in response to the first input signal to produce a first current;
    (c) introducing an amount of current equal to the first current into a current summing conductor coupled to the sources of the first transistor and second transistor and the tail current source;
    (d) operating a second amplifying circuit of the differential input circuit in response to the second input signal to produce a second current;
    (e) introducing an amount of current equal to the second current into the current summing conductor, the first and second currents boosting currents flowing through the second and first transistors, respectively; and
    (f) conducting the currents flowing through the first and second transistors through the first and second output conductors, respectively, to the output circuit.

2. The method of claim 1 including operating the first amplifying circuit to maintain at least a minimum current in the first transistor, and operating the second amplifying circuit to maintain at least the minimum current in the second transistor.

3. The method of claim 2 wherein the minimum current is approximately equal to half of a minimum current supplied by the tail current source.

4. A method of operating a differential input circuit to provide slew boost currents to an output circuit, comprising:
   (a) providing a differential current steering circuit including a first transistor having a gate coupled to receive a first input signal, a second transistor having a gate coupled to receive a second input signal, and a constant current source coupled to sources of the first and second transistors, and providing first and second outputs of the differential input circuit coupled to the first and second transistors, respectively;
   (b) operating a first slew current circuit of the differential input circuit in response to the first input signal to produce a first slew boost current and introducing the first slew boost current into a current summing conductor coupled to the sources of the first transistor and second transistor and the constant current source;
   (c) operating a second slew current circuit of the differential input circuit in response to the second input signal to produce a second slew boost current and introducing the second slew boost current into the current summing conductor, the first and second slew boost currents boosting currents flowing through the second and first transistors, respectively; and
   (d) conducting the currents flowing through the first and second transistors through the first and second output conductors, respectively, to the output circuit.

5. The method of claim 4 wherein step (d) includes coupling drains of the first and second transistors directly to the first and second outputs of the differential input circuit, respectively.

6. The method of claim 5 including coupling the current summing conductor to third and fourth outputs of the differential input circuit by means of third and fourth transistors, respectively.

7. The method of claim 4 wherein step (d) includes coupling the current summing conductor to the first and second outputs of the differential input circuit by means of third and fourth transistors, respectively.

8. A differential input circuit for providing slew boost currents to an output circuit, the differential input circuit comprising:
   (a) a differential current steering circuit including a first input transistor having a gate coupled to receive a first input signal, a second input transistor having a gate coupled to receive a second input signal, and a tail current source coupled to sources of the first and second input transistors, the first and second input transistors having drains connected to first and second outputs of the differential input circuit, respectively;
   (b) a first sensing transistor having a gate coupled to the gate of the first input transistor, and a drain coupled to a first supply voltage conductor, and a second sensing transistor having a gate coupled to the gate of the second input transistor, and a drain coupled to the first supply voltage conductor;
   (c) a first amplifying circuit having an input coupled to the source of the first sensing transistor and a first output coupled to control the tail current source to increase the flow of current into a first conductor coupled to the sources of the first and second input transistors; and
   (d) a second amplifying circuit having an input coupled to the source of the second sensing transistor and a first output coupled to control the tail current source to increase the flow of current into the first conductor.

9. The differential input circuit of claim 8 wherein the first amplifying circuit includes a second output coupled to maintain at least a minimum current in the first input transistor, and the second amplifying circuit includes a second output coupled to maintain at least the minimum current in the second input transistor.

10. The differential input circuit of claim 9 wherein the minimum current in the first and second input transistors is slightly less than a minimum current supplied by the tail current source.

11. A differential input circuit for providing slew boost currents to an output circuit, the differential input circuit comprising:
   (a) a differential current steering circuit including a first transistor having a gate coupled to receive a first input signal, a second transistor having a gate coupled to receive a second input signal, and a constant current source coupled to sources of the first and second transistors, the first and second transistors having drains connected to first and second outputs of the differential input circuit, respectively;
   (b) a first slew current circuit including a third transistor having a gate coupled to the gate of the first transistor, and a drain coupled to a first supply voltage conductor, a fourth transistor having a first electrode coupled to a source of the third transistor, and a second electrode and a control electrode coupled to a second constant current source, and a fifth transistor having a control electrode coupled to the control electrode of the fourth transistor, a first electrode coupled by a first conductor to the source of the first transistor, and a second electrode coupled to a third output of the differential input circuit; and
   (c) a second slew current circuit including a sixth transistor having a gate coupled to the gate of the second transistor, a drain coupled to the first supply voltage conductor, a seventh transistor having a first electrode coupled to a source of the sixth transistor, and a second electrode and a control electrode coupled to a third constant current source, and an eighth transistor having a control electrode coupled to the control electrode of the seventh transistor, a first electrode coupled by the first conductor to the source of the second transistor, and a second electrode coupled to a fourth output of the differential input circuit.

12. The differential input circuit of claim 11 wherein the fourth, fifth, seventh, and eighth transistors are N-channel transistors.

13. The differential input circuit of claim 11 wherein the fourth, fifth, seventh, and eighth transistors are NPN transistors, the first the electrodes are emitters, the second electrodes are collectors, and the control electrodes are bases.

14. An operational amplifier comprising:
   (a) a differential input circuit for providing slew boost currents, the differential input circuit including
      i. a differential current steering circuit including a first transistor having a gate coupled to receive a first input signal, a second transistor having a gate coupled to receive a second input signal, and a constant current source coupled to sources of the first and second transistors, the first and second transistors having drains connected to first and second outputs of the differential input circuit, respectively,
      ii. a first slew current circuit including a third transistor having a gate coupled to the gate of the first transistor and a drain coupled to a first supply voltage conductor, a fourth transistor having a first electrode coupled to a source of the third transistor, and a second electrode and a control electrode coupled to a second constant current source, and a fifth transistor having a control electrode coupled to the control electrode of the fourth transistor, a first electrode coupled by a first conductor to the source of the first transistor, and a second electrode coupled to a third output of the differential input circuit, iii. a second slew current circuit including a sixth transistor having a gate coupled to the gate of the second transistor, a drain coupled to the first supply voltage conductor, a seventh transistor having a first electrode coupled to a source of the sixth transistor, and a second electrode and a control electrode coupled to a third constant current source, and an eighth transistor having a control electrode coupled to the control electrode of the seventh transistor, a first electrode coupled by the first conductor to the source of the second transistor, and a second electrode coupled to a fourth output of the differential input circuit; and (b) an output circuit including a pull-up transistor coupled to at least one of the third and fourth outputs of the differential input circuit, and a pull-down transistor coupled to at least one of the first and second outputs of the differential input circuit.

15. The operational amplifier of claim 14 including first folded cascode transistor circuitry coupling the first and second outputs of the differential input circuit to the pull-down transistor, and second folded cascode transistor circuitry coupling the third and fourth outputs of the differential input circuit to the pull-up transistor.

16. The operational amplifier of claim 14 including a first gain boost amplifier coupled between the first folded cascode transistor circuitry and the gate of the pull-up transistor, and a second gain boost amplifier coupled between the second folded cascode transistor circuitry and the gate of the pull-down transistor.

17. The operational amplifier of claim 15 wherein the first folded cascode circuitry includes a ninth transistor having a source coupled to a second supply voltage conductor and a drain coupled to the fourth output of the differential input circuit, a tenth transistor having a source coupled to the fourth output of the differential input circuit and a drain coupled to a gate of the ninth transistor, and an eleventh transistor having a source coupled to the second supply voltage conductor, a gate coupled to the gate of the ninth transistor, and a source coupled to the third output of the differential input circuit and to a source of the pull up transistor.

18. The operational amplifier of claim 15 wherein the second folded cascode circuitry includes a ninth transistor having a source coupled to the first supply voltage conductor and a drain coupled to the first output of the differential input circuit, a tenth transistor having a source coupled to the first output of the differential input circuit and a drain coupled to a gate of the ninth transistor, and an eleventh transistor having a source coupled to the first supply voltage conductor, a gate coupled to the gate of the ninth transistor, and a source coupled to the second output of the differential input circuit and to a source of the pull down transistor.

19. The operational amplifier of claim 15 wherein the first folded cascode circuitry includes a ninth transistor having a source coupled to a second supply voltage conductor and a drain coupled to the fourth output of the differential input circuit, a tenth transistor having a source coupled to the fourth output of the differential input circuit and a drain coupled to a gate of the ninth transistor, and an eleventh transistor having a source coupled to the second supply voltage conductor, a gate coupled to the gate of the ninth transistor, and a source coupled to the third output of the differential input circuit and to a source of the pull up transistor, and wherein the second folded cascode circuitry includes a twelfth transistor having a source coupled to the first supply voltage conductor and a drain coupled to the first output of the differential input circuit, a thirteenth transistor having a source coupled to the first output of the differential input circuit and a drain coupled to a gate of the twelfth transistor, and a fourteenth transistor having a source coupled to the first supply voltage conductor, a gate coupled to the gate of the twelfth transistor, and a drain coupled to the second output of the differential input circuit and to a source of the pull down transistor.

20. The operational amplifier of claim 19 including a current source having a first terminal coupled to the drain of the tenth transistor and a second terminal coupled to the drain of the thirteenth transistor.

21. The operational amplifier of claim 20 wherein the first, second, third, sixth, ninth, tenth, and eleventh transistors are P-channel transistors, and the twelfth, thirteenth, and fourteenth transistors are N-channel transistors.

22. The operational amplifier of claim 21 wherein the fourth, fifth, seventh, and eighth transistors are NPN transistors.

* * * * *